(12) United States Patent
Anderson et al.

(10) Patent No.: US 6,340,621 B1
(45) Date of Patent: Jan. 22, 2002

(54) THIN FILM CAPACITOR AND METHOD OF MANUFACTURE

(75) Inventors: Wayne A. Anderson, Orchard Park, NY (US); Lin Huang Chang, Keelung (TW)

(73) Assignee: The Research Foundation of State University of New York, Amherst, NY (US)

( * ) Notice: Subject to any disclaimer, the term of this patent is extended or adjusted under 35 U.S.C. 154(b) by 0 days.

(21) Appl. No.: 09/387,019

(22) Filed: Aug. 31, 1999

Related U.S. Application Data

(60) Provisional application No. 60/030,097, filed on Oct. 30, 1996.

(51) Int. Cl.[7] .............................................. H01L 21/20
(52) U.S. Cl. .......................... 438/396; 438/3; 316/311
(58) Field of Search ............................ 438/396, 3, 240, 438/778, 783, 785; 257/295, 303, 306, 310; 361/311, 312, 313

(56) References Cited

U.S. PATENT DOCUMENTS 4,437,139 A * 3/1984 Howard ...................... 361/313
5,390,072 A * 2/1995 Anderson et al. ........... 361/313
5,978,207 A * 11/1999 Anderson et al. ........... 361/311

FOREIGN PATENT DOCUMENTS

JP          9126920 A  *  5/1997

* cited by examiner

*Primary Examiner*—Olik Chaudhuri
*Assistant Examiner*—Theresa T. Doan
(74) *Attorney, Agent, or Firm*—Hodgson Russ LLP

(57) ABSTRACT

Ferroelectric $PbZr_xT_{1-x}O_3$ (PZT) thin films are deposited on Pt coated Si substrates by using RF magnetron sputtering. A method for obtaining desirable stoichiometric PZT, the desired ferroelectric perovskite phase, and better dielectric properties using a PZT target with Pb/(Zr+Ti) ratio of 1.2 and depositing at 350° C., followed by thermal treatment at 620° C. for 30 min is disclosed. The structural and electrical properties of the PZT layer were further improved by a method of fabricating a novel multi-layer structure which combined the PZT thin film with nanolayers of $BaTiO_3$. The method and device of the present invention provided reduced leakage current density while maintaining high relative effective dielectric constants.

3 Claims, 6 Drawing Sheets

THIN FILM CAPACITOR AND METHOD OF MANUFACTURE

This application was filed as a provisional application, Ser. No. 60/030,097, filed Oct. 30, 1996, hereby incorporated by reference.

BACKGROUND OF THE INVENTION

1. Field of the Invention

The present invention relates generally to thin film capacitors having high dielectric constants and more particularly to thin film dielectric articles comprising a thin film layer of ferroelectric material in combination with a thin film layer of an amorphously configured low leakage dielectric material.

2. Description of the Related Art

In forming dielectric articles such as semiconductor integrated circuit devices, it is desirable to utilize capacitive elements that have high capacitance in small dimensioned, planar structures to improve the electrical performance and particularly to improve the response of integrated memory circuits. A typical capacitor comprises a pair of electrode layers having dielectric material therebetween. Voltage is applied across the electrode layers and a charge is stored in the capacitor with the amount of charge being storable in the capacitor, e.g. the capacitance, being proportional to the opposing areas of the electrodes and the dielectric material.

Capacitance has also been found to be inversely proportional to the thickness of the dielectric material, thus thin film capacitors are generally seen as a preferable means to achieve high performance. Problems still exit however, in optimizing the performance of thin film capacitors, so there is a continuing need to improve electrical properties, such as attaining higher dielectric constants and lowering charge dissipation factors.

Further, it is often highly desirable in the fabrication of electrical devices such as capacitors to minimize leakage current while maximizing capacitance per unit area.

It has been found that leakage current can be controlled by utilizing Schottky barriers such as lead zirconium titanate (hereinafter PZT) in conjunction with Platinum (hereinafter Pt) electrodes. However, interdiffusion between the PZT layer and bottom electrodes of capacitors of this type has been a problem in that deterioration of the electrical properties of the capacitors and reduced crystallinity of the PZT films can result. A preferred embodiment of the present invention provides a structure combining PZT and one or more $BaTiO_3$ (hereinafter BTO) layers. According to a preferred embodiment of the present invention, one or more $BaTiO_3$ layers may be employed to suppress the interdiffusion between Pt electrodes and the Pb element of the PZT layer. In addition, the combination of PZT and BTO according to a preferred method of the present invention has a synergistic effect and acts to increase the crystallinity of the PZT films. Thus, the present invention provides a capacitor having a high dielectric constant and lower leakage current than previously obtainable.

European Patent 46,868 discloses fabrication of capacitor structures using dielectrics having high dielectric constants and discusses some of the problems associated therewith, particularly the tendency of dielectric materials having a high dielectric constant to degrade rapidly at higher temperatures and their forming a capacitor structure that includes dual dielectric layers, comprising a first dielectric layer of silicon nitride or aluminum oxide and a second layer selected from a specific group of selected metal oxides and titanates. Such dual layered dielectric capacitors are said to have high capacitance (epsilon/t>0.04) and satisfactory Pb and dielectric loss.

U.S. Pat. No. 4,734,340 discloses an improved thin film capacitor wherein a particularly thin film dielectric layer, having high dielectric capacitance, is deposited by a sputtering technique and comprises a mixture of tantalum and titanium oxides.

U.S. Pat. No. 4,803,591 discloses an improved capacitor comprising layers of dielectric ceramic compositions of high dielectric constant. The ceramic compositions are characterized as comprising magnesium dioxide together with barium titanate, niobium pentoxide and zinc oxide. The capacitors formed from such ceramic compositions are said to have high dielectric constant with decreased temperature dependency over a wide temperature range.

U.S. Pat. No. 4,873,610 discloses a dielectric article having a laminate of plural thin film dielectric material layers, comprising a combination of dielectric material layers, that have different temperature characteristics of permittivity. The patent specifies that opposing laminates constitute different dielectric compositions for attaining adjacent layers having different temperature characteristics of permittivity. The reference does not disclose or infer that layers constituting the same dielectric material can have different temperature characteristics of permittivity.

U.S. Pat. No. 4,931,897 discloses a semiconductor element and method of manufacture wherein a lower electrode, having a polycrystalline silicon film thereon, is treated so that the silicon film comprises an amorphous silicon surface. A thin film of dielectric material is thereafter deposited on the amorphous silicon surface in such a manner that the amorphous surface does not recrystallize to a polycrystalline form. The stated objective of the patent is to produce an interface, between the polycrystalline silicon film serving as the lower electrode and the dielectric film, that is flat and uniform to prevent pinholes and electric field concentration. The reference does not disclose the formation of a dielectric film having an amorphous and a polycrystalline layer.

Thus, though the prior art is replete with proposed solutions for manufacture of optimized and dielectric articles, such solutions have not sufficiently met the ever increasing demand of the emerging industry for their various uses.

SUMMARY OF THE INVENTION

The invention comprises a chemically and electronically stable thin film capacitor, having a high dielectric constant and small current leakage, prepared by a method comprising forming a thin film layer of an amorphous dielectric material on the surface of a thin film layer of ferroelectric dielectric material, the ferroelectric dielectric material being a different dielectric material than the dielectric material comprising the amorphous film layer, and arranging the double layer between upper and lower electrodes. Favorable properties of PZT films have been achieved employing the teachings of the present invention. For example, PZT films produced in accordance with the principles of the present invention were observed to have leakage current $2 \times 10^{-7} A/cm^2 @ 4 \times 10^5 V/cm$, breakdown field ($E_B$) of $1 \times 10^6$ V cm, dielectric constant ($\in_r$) of 548 and tan δ=0.03.

In a preferred embodiment, a thin film microcrystalline layer of a suitable dielectric material, preferably $BaTiO_3$ (BTO), is formed on a semiconductor substrate structure that includes a metal lower electrode. A polycrystalline layer of a suitable dielectric material, which is preferably the same dielectric material as that comprising the above-mentioned microcrystalline layer, and most preferably BTO, is formed on the microcrystalline layer. A layer of ferroelectric material of high dielectric constant, the ferroelectric material being different from any material comprising any other layer, the material preferably comprising $PbZr_xTi_{1-x}O_3$ (PZT), is formed on the polycrystalline layer. Finally, an amorphous layer of a suitable dielectric material, preferably the same dielectric material as that comprising the microcrystalline layer and preferably BTO, is formed on the layer of ferroelectric material, the amorphous layer being in communication with a metal upper electrode.

An object of the instant invention is to provide dielectric articles which reduce the leakage problems associated with the use of the various dielectric films.

Another object of the invention is to provide a thin film capacitor that has improved resistance to leakage and has resistance to electric field concentration.

A further object is to provide a method for the formation of thin film dielectric articles that reduces leakage and/or electric field concentration of the articles.

A still further object is to provide a thin film capacitor that has improved capacitance per unit film area.

A still further object of the invention is to provide a method for the preparation of PZT films which results in a PZT film having improved stoichiometric properties.

Still other objects and advantages of the present invention will become readily apparent to those skilled in this art from the following detailed description, wherein preferred embodiments are shown and described, simply by way of illustration of the best mode contemplated by the inventors for carrying out the invention. As will be realized, the invention is capable of other and different embodiments, and its several details are capable of modifications in various obvious respects, all without departing from the invention. Accordingly, the drawings and description are to be regarded as illustrative in nature and not as restrictive.

BRIEF DESCRIPTION OF THE DRAWINGS

For a further understanding of the invention, as well as its characterizing features, reference should now be made to the accompanying drawings wherein.

DETAILED DESCRIPTION OF THE INVENTION

Figure 4A:
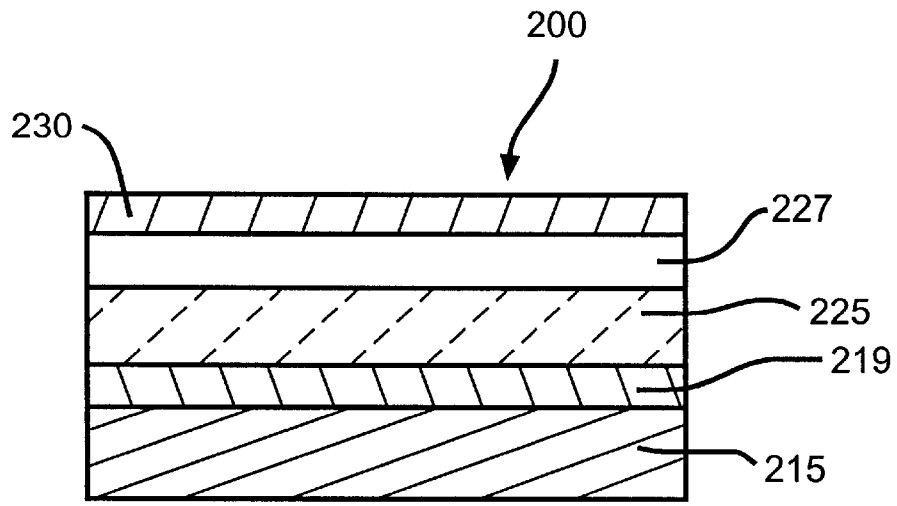
FIG. 4a is a block diagram showing the general structural features and composition of a semiconductor capacitive element according to the present invention.
Figure 4B:
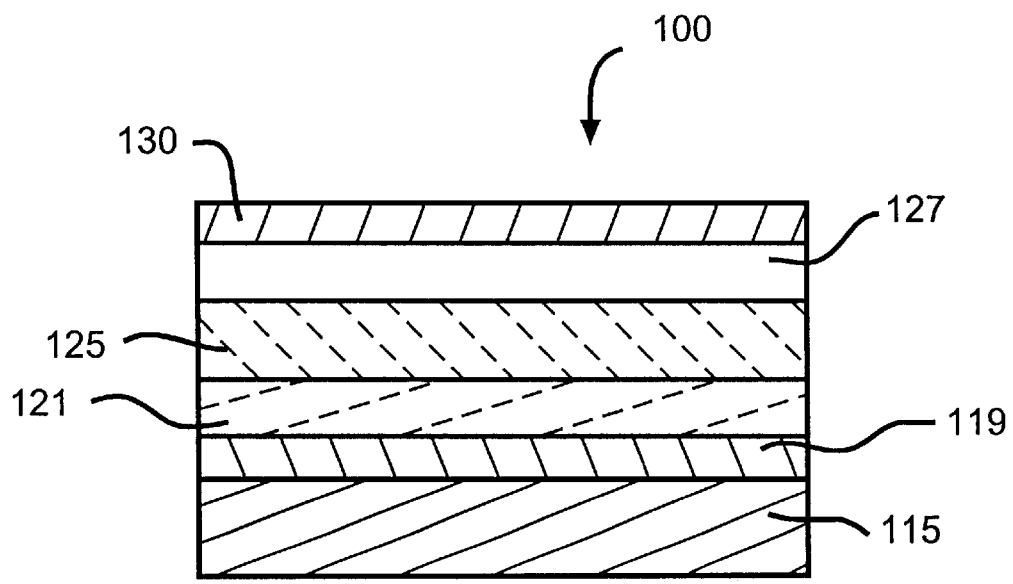
FIG. 4b is a block diagram showing the general structural features and composition of a first alternative embodiment of a semiconductor capacitive element according to the present invention.
Figure 4C:
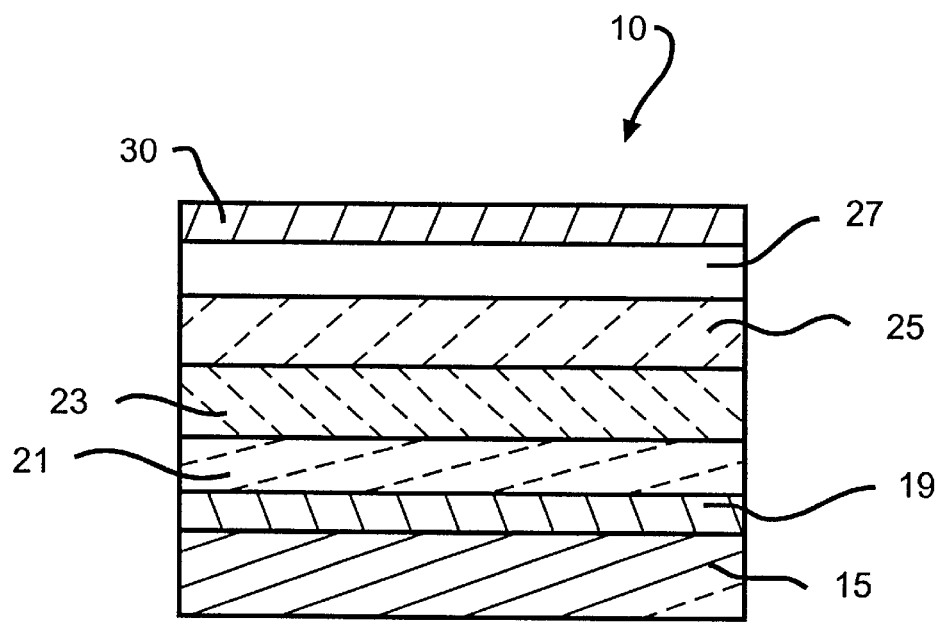
FIG. 4c is a block diagram showing the general structural features and composition of a preferred embodiment of a semiconductor capacitive element according to the present invention.

Referring to the drawings, FIGS. 4a, 4b and 4c are block diagrams showing the general structural features of capacitors constructed in accordance with the principles of the present invention.

In FIG. 4a, capacitor 200 comprises a metal lower electrode 219 engaging a semiconductor substrate 215 upon which metal lower electrode 219 is formed. In this embodiment capacitive element 200 comprises a substrate 215, lower electrode means 219, upper electrode means 230 and two film layers, 225 and 227, of a dielectric material arranged in opposing juxtaposition between upper electrode means 230 and lower electrode means 219.

Figure 5:
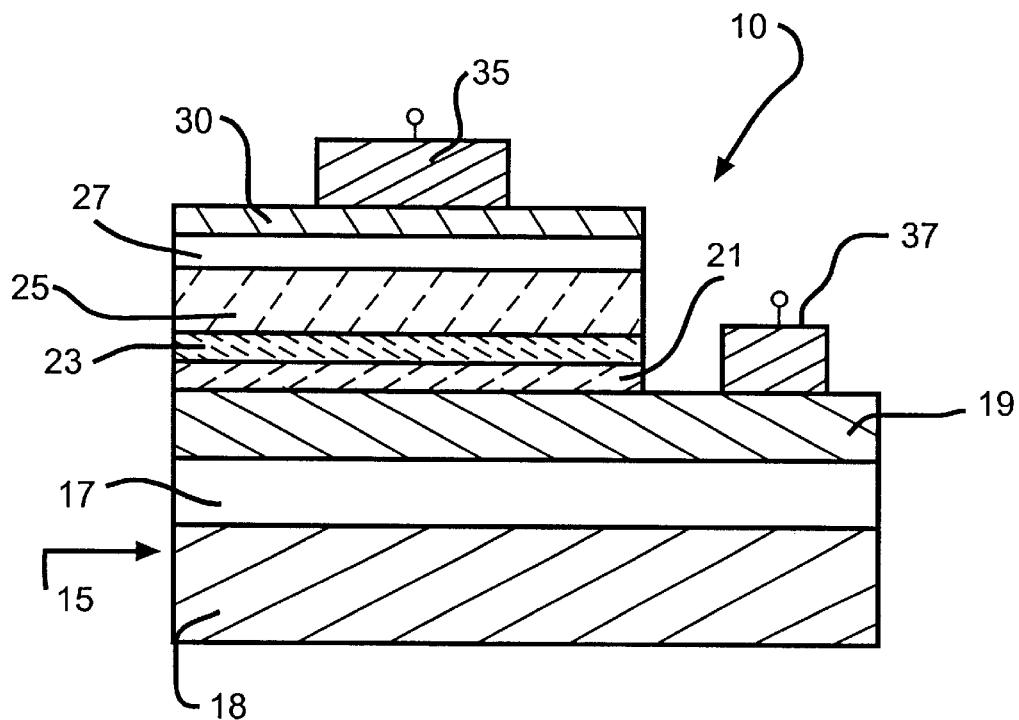
FIG. 5 is a sectional view of the preferred embodiment of a semiconductor capacitive element according to the present invention, including electrical contact means.

Substrate 215 is preferably a (100)-oriented p-Si wafer which has been treated or otherwise prepared to have deposited thereupon lower electrode means 219. Preferably, the surface of substrate 215 is prepared for deposition of the material comprising lower electrode means 219 by cleaning and/or otherwise treating substrate 215 to remove impurities, oxides and the like, and/or to create a smoothly refined surface to avoid pinholes from forming upon deposition of the electrode means material. Substrate 215 may be treated to provide a polished surface and oxidized in a wet $O_2$ atmosphere to provide an oxide layer (as best illustrated in FIG. 5 at 17). Other suitable substrate structures comprise materials such as SiC, GaAs, CdS, ZnO, ZnS or the like.

Upper electrode means 230 and lower electrode means 219 generally may be constructed from a suitably conductive metallic oxide or metal such as aluminum, copper, gold, silver, platinum, palladium, lead, ruthenium and metallic oxides such as $RuO_2$ and the like. In a preferred embodiment upper and lower electrode means 230 and 219 comprise platinum (Pt). In a preferred embodiment the Pt layer comprising lower electrode means 219 is a Pt film having a preferred thickness of about 200 nm. In constructing a capacitor in accordance with the principles of the present invention a (111)-oriented Pt film was utilized. However, this orientation is not to be considered limiting, as other orientations may be utilized with good results.

To construct the embodiment of FIG. 4a, the Pt layer comprising lower electrode means 219 may be deposited on the polished surface of substrate 215 by means of RF magnetron sputtering carried out at a substrate temperature of about 350° C. Other substrate temperatures ranging from about room temperature up to about 350° C. or higher may be used with acceptable results.

In the presently preferred embodiment, a pure Pt target of about one inch diameter may be sputtered in an Argon (Ar) ambient atmosphere having a base pressure greater than about $2 \times 10^{-6}$ Torr. The total Ar pressure and power during Pt deposition are preferably kept at about 10 mTorr. and about 50 Watts respectively.

Dielectric film layer 225 is formed upon Pt layer 219. Dielectric film layer 225 is a ferroelectric material having a high dielectric constant, preferably a thin film layer of $PbZr_xTi_{1-x}O_3$ (PZT) having a preferred thickness of about 200 nm. To arrive at the embodiment depicted in FIG. 4a, PZT layer 225 is deposited upon Pt layer 219 by means of RF magnetron sputtering at a substrate temperature of about 350° C. for about 30 minutes after which PZT layer 225 is preferably furnace annealed at about 620° C. for about 30 minutes.

Top amorphous layer 227 comprises an amorphous layer of a suitable dielectric material exhibiting low leakage current. Suitable dielectric materials which may be used in the invention are $BaTiO_3$, $SrTiO_3$, $KNO_3$, $LiNbO_3$, $Bi_4Ti_3O_{12}$, $PbTiO_3$, $PbZrO_3$, $LaTiO_3$, $PbMgO_3$, $PbNbO_3$, $LaZrO_3$, and the like. A most preferred dielectric material for top amorphous layer 227 is $BaTiO_3$ (BTO). Preferably, a thin film layer of $BaTiO_3$ (BTO) having a thickness of about 15 nm. is deposited upon PZT layer 225 by means of RF magnetron sputtering. Substrate temperatures during sputtering can range from about room temperature up to about 350° C.

Upper metal electrode 230 may be formed upon top amorphous layer 227 such that upper metal electrode 230 is in communication with top amorphous layer 227.

An alternative embodiment of a capacitor 100 constructed in accordance with the principles of the present invention is depicted in FIG. 4b. Capacitor 100 comprises a metal lower electrode 119 engaging a semiconductor substrate 115 upon which metal lower electrode 119 is formed. In this embodiment capacitive element 100 comprises a substrate 115, lower electrode means 119, upper electrode means 130 and three film layers, 127, 125 and 121, of a dielectric material, the film layers arranged in opposing juxtaposition between upper electrode means 130 and lower electrode means 119.

Substrate 115 of the preferred embodiment comprises a (100)-oriented p-Si wafer which has been treated or otherwise prepared to have deposited thereupon lower electrode means 119. Preferably, the surface of substrate 115 is prepared for deposition of the material comprising lower electrode means 119 by cleaning and/or otherwise treating substrate 115 to remove impurities, oxides and the like, and/or to create a smoothly refined surface to avoid pinholes from forming upon deposition of the electrode means material. Substrate 115 may be treated to provide a polished surface and may be, but is not necessarily, oxidized in a wet $O_2$ atmosphere. Other suitable substrate materials comprise materials such as SiC, GaAs, CdS, ZnO, ZnS or the like. Substrate 15 may be a semiconductor substrate, or may be constructed from a dielectric, metal, or glass material.

Upper electrode means 130 and lower electrode means 119 generally may be constructed from a suitably conductive metallic oxide or metal such as aluminum, copper, gold, silver, platinum, palladium, lead, ruthenium and metallic oxides such as $RuO_2$ and the like. In a preferred embodiment upper and lower electrode means 130 and 119 comprise platinum (Pt) In constructing the capacitor of the preferred embodiment, the Pt layer comprising lower electrode means 119 was a (111)-oriented Pt film having a preferred thickness of about 200 nm. However, other Pt orientations and thicknesses may be employed without departing from the teachings of the present invention.

To construct the embodiment of FIG. 4b, the Pt layer comprising lower electrode means 119 may be deposited on the polished surface of substrate 115 by means of RF magnetron sputtering carried out at a substrate temperature which can be about room temperature up to about 350° C. For example, a pure Pt target of about one inch diameter may be sputtered in an Argon (Ar) ambient atmosphere having a base pressure greater than about $2 \times 10^{-6}$ Torr. The total Ar pressure and power during Pt deposition are preferably kept at about 10 mTorr. and about 50 watts respectively.

Dielectric film layer 121 is formed upon Pt layer 119. Dielectric film layer 121 comprises a polycrystalline layer of suitable material exhibiting low leakage current. Suitable materials exhibiting low leakage current are, for example, $BaTiO_3$, $SrTiO_3$, $KNO_3$, $LiNbO_3$, $Bi_4Ti_3O_{12}$, $PbTiO_3$, $PbZrO_3$, $LaTiO_3$, $PbMgO_3$, $PbNbO_3$, $LaZrO_3$, and the like. Preferably, dielectric film layer 121 comprises a polycrystalline layer of $BaTiO_3$ (BTO). BTO is preferred due to its low leakage current characteristics and easily controllable microstructure.

Engaging dielectric film layer 121 is dielectric film layer 125. Dielectric film layer 125 is a ferroelectric material having a high dielectric constant, and is preferably a thin film layer of $PbZr_xTi_{1-x}O_3$ (PZT) having a preferred thickness of about 200 nm. To arrive at the embodiment depicted in FIG. 4b, PZT layer 125 is deposited upon dielectric film layer 121 by means of RF magnetron sputtering at a substrate temperature of about 350° C. for about 30 minutes after which PZT layer 125 is preferably furnace annealed at about 620° C. for about 30 minutes.

Layer 121 serves as a "seed" to control nucleation of layer 125, thus greatly increasing the dielectric constant of layer 125 and capacitive element 100.

Top amorphous layer 127 comprises an amorphous layer of a suitable dielectric material exhibiting low leakage current. Suitable dielectric materials which may be used in the invention are $BaTiO_3$, $SrTiO_3$, $KNO3$, $LiNbO_3$, $Bi_4Ti_3O_{12}$, $PbTiO_3$, $PbZrO_3$, $LaTiO_3$, $PbMgO_3$, $PbNbO_3$, $LaZrO_3$, and the like. A most preferred dielectric material for top amorphous layer 127 is $BaTiO_3$ (BTO). Preferably, a thin film layer of $BaTiO_3$ (BTO) having a thickness of about 15 nm. is deposited upon PZT layer 125 by means of RF magnetron sputtering. Substrate temperatures from room temperature up to about 350° C. may be used. Layer 127 is amorphous and serves to limit current.

Upper metal electrode 130 may be formed upon top amorphous layer 127 such that upper metal electrode 130 is in communication with top amorphous layer 127.

FIG. 4c is a block diagram and FIG. 5 is a cross-sectional view of a preferred embodiment of a high dielectric constant, low leakage, thin film capacitor 10 in accordance with the present invention. Substrate 15 may be a semiconductor substrate, or may be constructed from a dielectric, metal, or glass material. In constructing the embodiment shown in FIGS. 4c and 5, substrate 15 is a (100)-oriented p-Si wafer. Substrate 15 may include a oxide layer 17 which may, or may not, be oxidized in a wet $O_2$ atmosphere.

Platinum (Pt) layer 19 serves as a lower electrode for capacitor 10. In the embodiment illustrated in FIGS. 4c and 5, Pt layer 19 is a (111)-oriented film having a thickness of about 200 nm. According to the method of the present invention, Pt layer 19 was deposited on oxide layer 17 by means of RF magnetron sputtering carried out at a substrate temperature of about 350° C. However, other substrate temperatures ranging from about room temperature up to about 350° C. may be utilized in the sputtering process. A pure Pt target of about one inch diameter was sputtered in an Argon (Ar) ambient atmosphere having a base pressure greater than about $2 \times 10^{-6}$ Torr. The total Ar pressure and power during Pt deposition were kept at about 10 mTorr. and about 50 Watts respectively.

An initially amorphous (a) first thin film layer 21 comprising a layer of $BaTiO_3$ (BTO) having a thickness of about 15 nm. was deposited upon Pt layer 19 by RF magnetron sputtering at a substrate temperature of about 300° C. As will be readily apparent to those skilled in the art, other substrate temperatures ranging from about room temperature up to about 350° C. may be employed in the sputtering process.

Polycrystalline second thin film layer 23 comprising a layer of BTO having a thickness of approximately 15 nm.

was deposited upon first thin film layer 21 by means of RF magnetron sputtering carried out at a substrate temperature of about 700° C. During the thermal treatment of second thin film layer 23 described above, first thin film layer 21 changed from an amorphous structure to a microcrystalline (m) structure.

PZT layer 25, having a thickness of about 200 nm. was deposited upon second thin film layer 23 by means of RF magnetron sputtering at a substrate temperature of about 350° C. for about 30 minutes after which PZT layer 25 was furnace annealed at about 620° C. for 30 minutes.

Top amorphous layer 27 comprising a thin film layer of BTO having a thickness of about 15 nm. was deposited upon PZT layer 25 by means of RF magnetron sputtering at a substrate temperature of about 350° C. As will be readily apparent to those skilled in the art, other substrate temperatures ranging from about room temperature up to about 350° C. may be employed in this process.

In practice, contact means 35 and 37, which are preferably gold (Au), may be disposed upon Pt layer 19 and upper electrode 30.

Preferred Embodiment and Method of Manufacture $PbZr_xTi_{1-x}O_3$ (PZT) is the preferred ferroelectric dielectric material for use in forming layer 25 of the preferred embodiment 10 of the invention as depicted in FIG. 5. This embodiment, as well as alternate embodiments employing PZT as the ferroelectric dielectric material, are suitable for applications including non-volatile memories and dynamic random access memories (DRAMs) due to the favorable hysteresis properties and high dielectric constant of PZT. Several methods of PZT thin film deposition may be employed in constructing the thin film PZT layer 25 of the present invention. These methods include chemical vapor deposition, chemical sol-gel process, laser ablation, and sputtering. Among these, sputtering is the preferred method because of its simplicity and convenience. However, deviation in the composition of films occurs from time to time due to the loss of Pb during the sputtering process. In addition, the interdiffusion between Pb and the bottom electrode, which deteriorates the structural and electrical properties of the ferroelectric PZT capacitors, poses a problem in practical application of the sputtering process.

The present invention addresses these, and other problems by providing an improved method for synthesis of PZT thin film layer 25 deposited on Si substrates using RF magnetron sputtering. According to the methods of the present invention, film composition, microstructure, dielectric, and electrical properties are considered as a function of target composition, deposition temperature and annealing conditions. The novel multi-layer preferred structure 10 of the present invention advantageously combines PZT layer 25 with the nanolayer $BaTiO_3$ layers, 21, 23, and 27, taking advantage of the superior electrical properties of the nanolayer $BaTiO_3$ structure. Further, the electrical properties of PZT layer 25 are improved. Since both $BaTiO_3$ and PZT have the same perovskite crystal structure, the degree of crystallinity of PZT film layer 25 for multi-layer structure 10 using $BaTiO_3$ as a seeding layer 23 for PZT nucleation will be increased. Furthermore, the $BaTiO_3$ layers 23 and 21 serve as barrier layers against the interdiffusion between Pb in the PZT layer and lower electrode 19.

Details of Method

The substrate 15 employed in fabricating capacitor 10 of FIG. 5 was a (100)-oriented p-Si wafer with oxide layer 17 oxidized in a wet $O_2$ atmosphere. The thickness of the $SiO_2$ layer comprising oxide layer 17 was about 200 nm. After cleaning substrate 15 in trichloroethylene, acetone, methanol, and rinsing several times in 18 MΩ cm deionized (DI) water, followed by drying in a nitrogen jet, Pt layer 19 was deposited upon oxide layer 17 at substrate 15 by RF magnetron sputtering at 350° C. to form lower electrode 19 for ferroelectric PZT capacitor 10. Pt was chosen for lower electrode 19 because of its favorable properties as an electrode material.

According to the method of the present invention, Pt layer 19 was deposited by the following method. A pure Pt target of one inch diameter was sputtered in an Ar ambient with the base pressure better than $2\times10^{-6}$ Torr. The total Ar pressure and power during Pt deposition were kept at 10 mTorr. and 50 W, respectively. The thickness of the lower Pt electrode 19 was around 200 nm. The resistivity of Pt measured by the four-point probe method was lower than 30 $\mu\Omega$ cm under such deposition conditions and the Pt film was (111)-oriented.

TABLE 1

The sputtering conditions of PZT thin films

| Parameters | Conditions |
|---|---|
| Target | PZT (one inch in diameter) |
| R.f. frequency | 13.56 MHz |
| Power density | 100 W cm$^{-2}$ |
| Gas ratio | $O_2/Ar + O_2 = 1/16$ |
| Total pressure | $Ar + O_2 = 8$ mTorr. |
| Substrate temperature | 25~500° C. |
| Film thickness | 100~200 nm. |

$BaTiO_3$ and ferroelectric PZT thin films were then deposited at different temperatures by using RF magnetron sputtering. Preparation of $BaTiO_3$ thin films has been published previously in Q. X. Jia, L. H. Chang and W. A. Anderson, *Thin Solid Films*, 259 (1995) 264; Q. X. Jia, L. H. Chang and W. A. Anderson, Ferroelectrics, 166 (1995) 111; and L. H. Chang and W. A. Anderson, *7th International Conference on Solid Films and Surfaces*, Hsinchu, Taiwan, Dec. 12–16, 1994, all of which are hereby incorporated by reference.

To address the presented problem by the preparation of PZT films at elevated temperatures, i.e. substantial Pb loss, the present invention provides a method of synthesis of PZT thin films with different Pb composition from that of the PZT target.

According to the method of the present invention, a one inch diameter PZT target was prepared by mixing the raw oxide powders, PbO, $ZrO_2$, and $TiO_2$, inside a one inch diameter stainless steel cylinder and then pressing at 38,000 pounds.

With a different atomic ratio of PbO, different PZT compositions, $Pb_{1.1}(Zr_{0.52}Ti_{0.48})$, $Pb_{1.2}(Zr_{0.52}Ti_{0.48})O_3$, and $Pb_{1.3}(Zr_{0.52}Ti_{0.48})O_3$, were fabricated to arrive at the preferred embodiment of the method of the present invention. The starting PZT target with excess Pb composition was prepared specifically to compensate for the lead loss during PZT deposition and/or post annealing processes.

The sputtering conditions of PZT thin films are listed in Table 1. Among those parameters listed in Table 1, target composition and substrate temperature were varied, while other parameters were fixed. The as-deposited PZT films were subjected to post thermal treatment at different temperatures from 500° C. to 700° C. with different times from 15 min. to 90 min. This was done at one Atm. in a tube furnace in air. The thermal treatment was purposely conducted to obtain the perovskite phase of PZT films which gave a pyrochlore structure for the as-deposited processes.

The structural properties of the Pt, $BaTiO_3$ and PZT films were analyzed by X-ray diffraction (XRD) from a Nicolet/

STOE diffractometer using C$\mu$ K$\alpha$ radiation. The film composition was realized by energy-dispersive X-ray analysis (EDAX). The leakage current density and hysteresis behavior were determined by the current-voltage (I–V) and polarization-electric field (P-E) measurements using a conventional Sawyer-Tower circuit operated at 60 Hz.

Results

Single PZT Layer

By comparing films deposited using different PZT target compositions as described above, the film composition, microstructure, and electrical properties of the films were examined as a function of sputtering conditions and thermal treatment. Particular attention was paid to films deposited on Pt bottom electrodes so that microstructure, dielectric, and electrical properties could all be measured on a single substrate, thereby more closely representing a typical memory device configuration, metal-ferroelectric-metal (MFM). Care was taken to maintain approximately the same thickness among different samples to establish a meaningful comparison of compositional, structural, and electrical properties.

Figure 1:
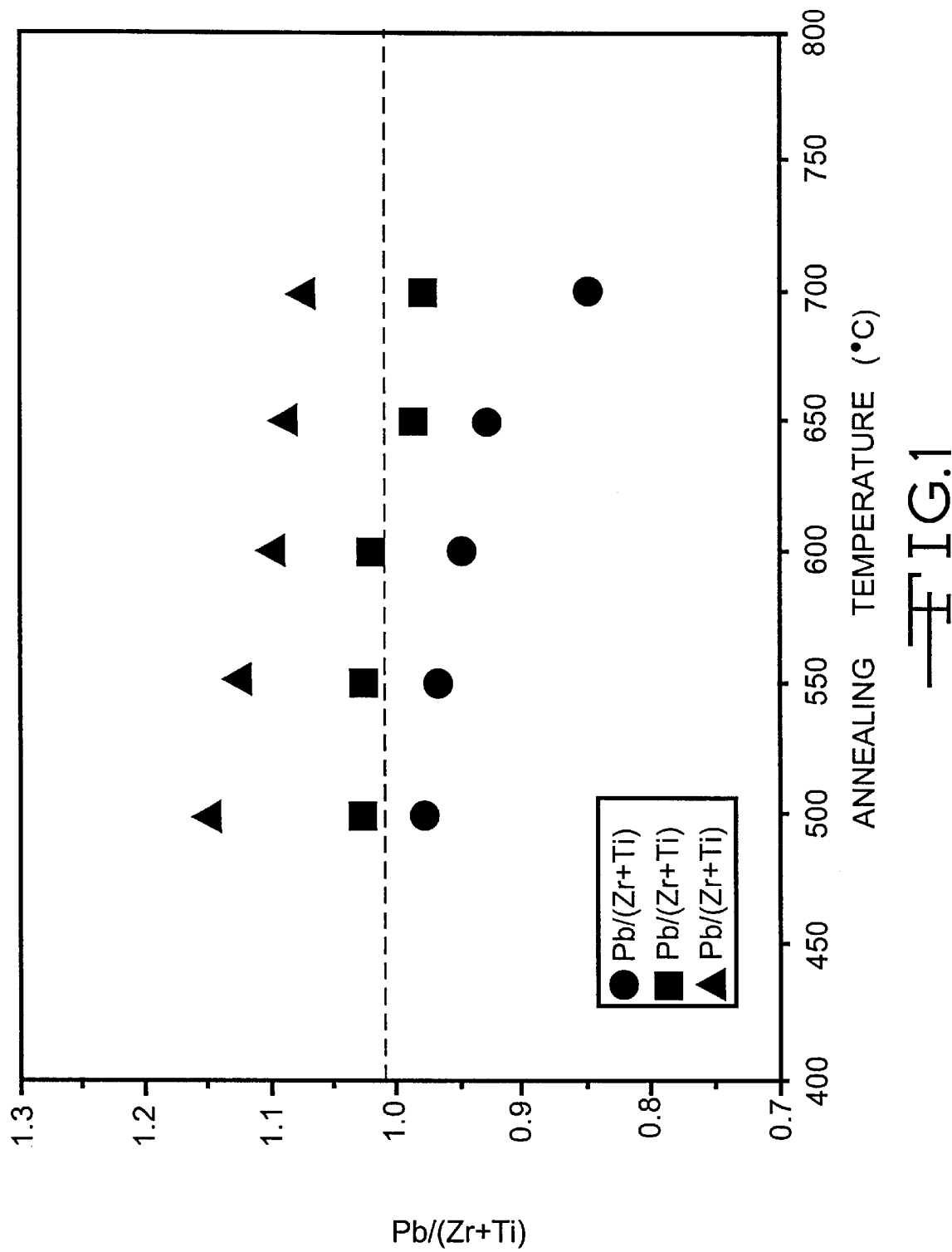
FIG. 1 shows the annealing temperature dependence of the Pb content ratio compared with the Pb/(Zr+Ti) with three different PZT target compositions.

FIG. 1 shows the annealing temperature dependence of the Pb content ratio, Pb/(Zr+Ti), with three different PZT target compositions, determined using EDAX. PZT films shown in FIG. 1 were prepared by sputtering at 350° C. with a power of 50 W followed by furnace annealing. The dashed line indicates the composition of the desired stoichiometric PZT phase. The Ti/(Zr+Ti) ratio, which was not shown in FIG. 1, was found to be fairly close to the composition of the target material for various targets and a wide range of annealing temperatures from 500° C. to 700° C. However, the composition deviation of films from that of the target is great for the Pb/(Zr+Ti) ratio. Also, there is some scatter for the Pb/(Zr+Ti) ratio through different thermal treatments. In general, about 20% loss of Pb content was observed after sputtering and post-annealing treatments described above. The thermal evaporation process is believed to be the major factor resulting in the compositional deviation.

For the PZT target with Pb/(Zr+Ti) of 1.1, there was a Pb deficiency of about 5% to 10% from the expected stoichiometric PZT perovskite phase. This resulted in a pyrochlore-type structure which gives poor dielectric and ferroelectric properties. On the contrary, excess Pb content of the prepared films from the PZT target with Pb/(Zr+Ti) ratio of 1.3, brought about lead oxide phases instead of the perovskite phase which caused a significant increase of leakage current density. From these results, it was determined that the PZT target with Pb/(Zr+Ti) ratio of 1.2 would be preferred as the starting target to prepare the films with ferroelectric perovskite phase although about 2% to 3% of excess Pb is shown in FIG. 1.

With Pb/(Zr+Ti) ratio of 1.2 for the PZT target, the substrate temperature was varied from 25° to 500° C. For the films deposited at a substrate temperature of 500° C., significant Pb loss was detected, resulting in "leaky" films, and strange film morphology, which is believed to be due to the severe interdiffusion or interaction between the deposited film and the underlying Pt layer, no matter what kind of target was used.

Figure 2:
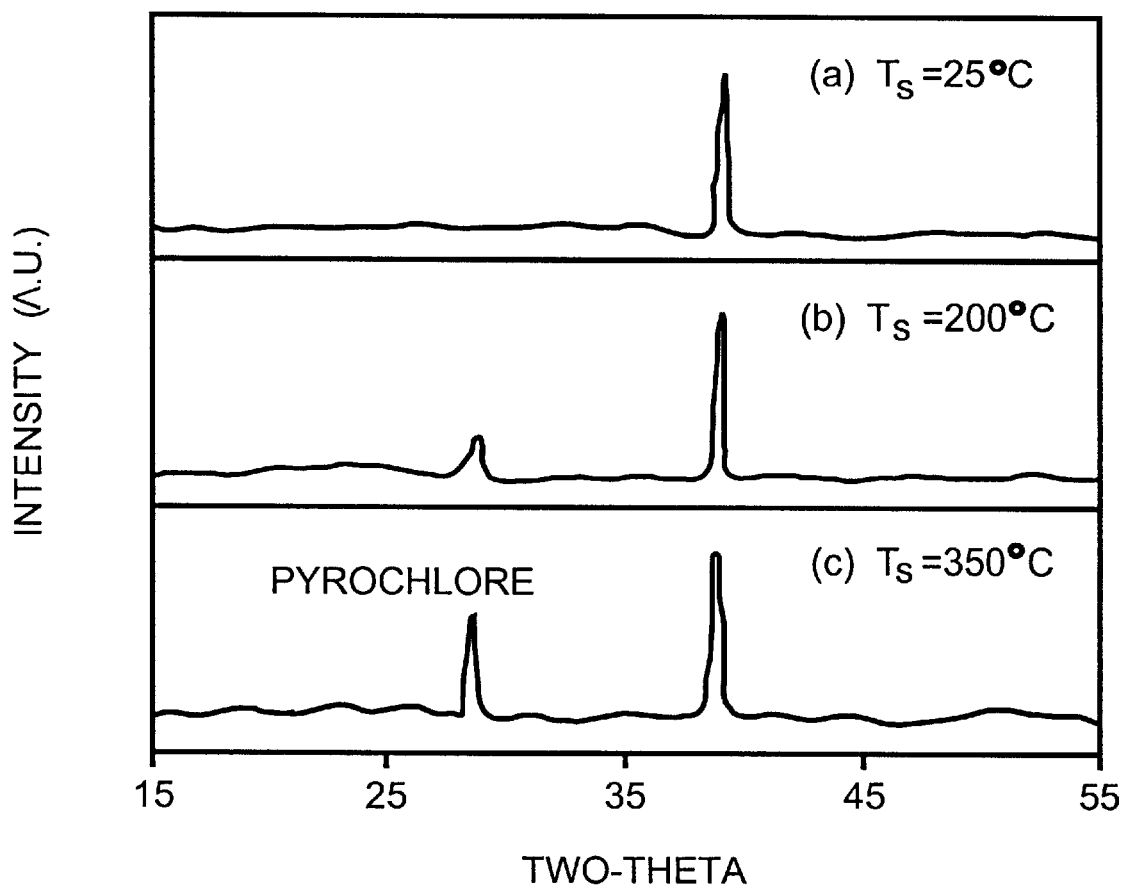
FIG. 2 shows the XRD patterns for the PZT films deposited at (a) 25° C., (b) 200° C., and (c) 350° C. without further thermal treatments.

The XRD patterns for the PZT films deposited at different temperatures without any further thermal treatments is illustrated in FIG. 2. The films deposited at 25° C. showed featureless XRD patterns. However, a diffraction peak at 2θ=29° was detected corresponding to the pyrochlore (222) phase for the as-deposited films at 350° C. This may be due to the formation of an oriented Pb-rich phase, caused by the excess Pb introduced into the film. The resulting as-deposited films with a substrate temperature of 350° C. generally had about 10% to 15% more Pb than stoichiometric PZT.

Figure 3:
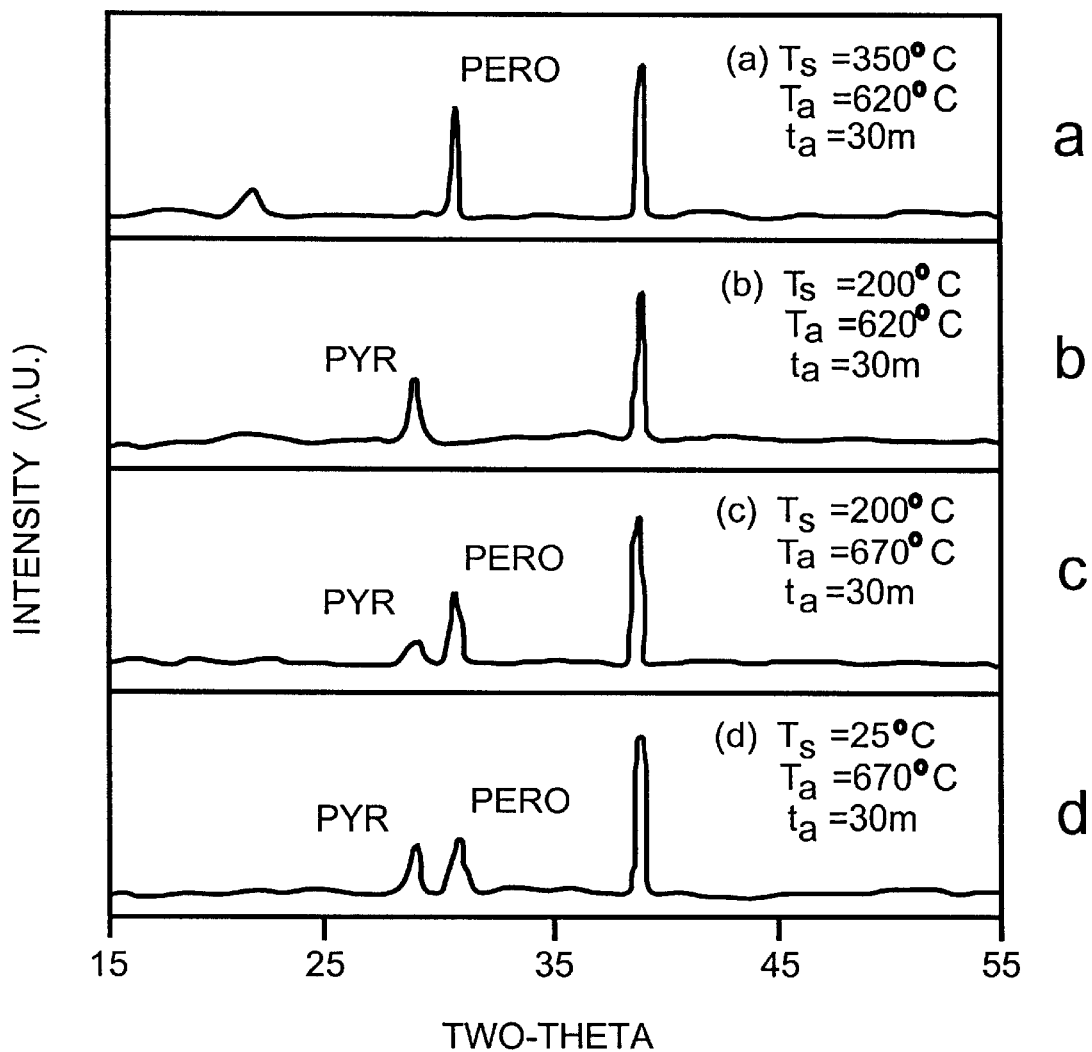
FIGS. 3a, 3b, 3c, and 3d show the XRD patterns for the PZT films deposited at different temperatures followed by different annealing temperatures (pyrochlore phase, pyr; and perovskite phase, pero).

Post-deposition annealing at a relatively higher temperature was expected to crystallize or transform the as-deposited amorphous films or pyrochlore phase into the perovskite phase. FIG. 3 shows the XRD patterns for the PZT films deposited at different temperatures followed by different annealing temperatures. In FIG. 3a, the X-ray diffraction peak shift from 2θ=28° to 2θ=31° was observed for the PZT films deposited at 350° C. followed by furnace annealing at 620° C. for 30 min. No significant peaks from other phases in the PZT films were observed. This corresponds to the transformation of the pyrochlore phase to the perovskite phase. Preferred orientation of the perovskite phase, shown in FIG. 3a, was a mixture of (101) and (110).

In FIGS. 3b and 3c, the PZT films were deposited at 200° C. (Ts) followed by furnace annealing at 620° C. (Ta) (FIG. 3b) and 670° C. (Ta) (FIG. 3c) for 30 min., respectively, where crystallization was observed for the films deposited at 200° C. At 670° C., crystalline peaks could not be unambiguously attributed to the perovskite phase because of their broadness and weak intensity, and the existence of small pyrochlore peaks. For the furnace annealing at 700° C. for 30 min. of the films deposited at 200° C., strange morphology with cracks and dots was observed. The crystallization of the film, while the amorphous films are subjected to heat treatment as high as 700° C., may be accompanied by out-diffusion and evaporation of Pb, diffusion of film elements into the substrate, and diffusion of substrate material towards the film surface. The migration of Pb into the underlying layer and the movement of Pt up through PZT grain boundaries and cracks were observed in the film shown in FIG. 3d, where the thermal treatment at 670° C. for 30 min. was carried out on the PZT films deposited at 250° C. A mixture of pyrochlore and perovskite phase was observed in FIG. 3d. Further, increasing the annealing temperature once again caused the severe interdiffusion of the PZT film with the substrate and substantial Pb loss. The low dielectric constant for thermal treatment higher than 700° C. provides the evidence for formation of an interface layer between the PZT film and Pt.

In summary, the PZT films deposited at 350° C. exhibited a high degree of crystallinity as-deposited and required less annealing to produce the desired perovskite phase, compared with those deposited at temperatures lower than 200° C. It was also observed that more Pb was retained in films deposited at 350° C. (about 3% Pb rich) than in those deposited at 25° C. (about 10% Pb deficient), after thermal treatment at 620° C. for 30 min. This may be due in part to the low volatility of Pb in the perovskite phase, as opposed to in the amorphous phase, or incipient crystallizing of the film. Thus, in comparison to films deposited at 25° C., those deposited at a temperature of 350° C. suffer less Pb loss and Pt diffusion for thermal conditions necessary to obtain the desired ferroelectric perovskite phase, making a temperature of about 350° C. preferred for the method of the present invention.

PZT films gave leakage current ($I_L$) of $2 \times 10^{-7}$ A/cm$^2$@$4 \times 10^5$V/cm, Table 2 illustrates the crystal structure types and Pb/(Zr+Ti) ratio for the PZT films deposited on Pt/SiO$_2$/Si with various processing conditions. From a stoichiometric viewpoint, the Pb/(Zr+Ti) ratio is less than 1.0 when the film forms a pyrochlore type structure. The XRD data showed that the perovskite type structure could not be obtained when the Pb content was low.

From these trials the preferred processing condition to obtain proper stoichiometric PZT, desired ferroelectric perovskite phase, and a better dielectric properties, is a PZT target having a Pb/(Zr+Ti) ratio of 1.2 and depositing at 350° C., followed by a thermal treatment at 620° C. for 30 min. This conclusion is supported by data in Table 2.

TABLE 2

The crystal structure types and Pb/(Zr + Ti) ratio for the PZT films with various processing conditions

| Target Composition Pb/(Zr + Ti) | Ts (° C.) | Annealing Temperature (° C.) | Film Composition Pb/(Zr + Ti) | Microstructure Type |
|---|---|---|---|---|
| Pb (1.1) | 25 | 620 | 0.92 | pyrochlore |
| Pb (1.1) | 200 | 620 | 0.94 | pyrochlore |
| Pb (1.1) | 350 | 620 | 0.95 | pyrochlore + Perovskite |
| Pb (1.1) | 25 | 670 | 0.90 | pyrochlore |
| Pb (1.1) | 200 | 670 | 0.93 | pyrochlore |
| Pb (1.1) | 350 | 670 | 0.94 | pyrochlore + Perovskite |
| Pb (1.2) | 25 | 620 | 0.98 | Perovskite + pyrochlore |
| Pb (1.2) | 200 | 620 | 1.02 | Perovskite |
| Pb (1.2) | 350 | 620 | 1.02 | Perovskite |
| Pb (1.2) | 25 | 650 | 0.97 | pyrochlore + Perovskite |
| Pb (1.2) | 200 | 650 | 1.02 | Perovskite |
| Pb (1.2) | 350 | 650 | 1.02 | Perovskite |
| Pb (1.3) | 25 | 620 | 1.08 | Pyrochlore |
| Pb (1.3) | 200 | 620 | 1.08 | Pyrochlore |
| Pb (1.3) | 350 | 620 | 1.10 | PbO + Perovskite |
| Pb (1.3) | 25 | 670 | 1.07 | pyrochlore |
| Pb (1.3) | 200 | 670 | 1.08 | pyrochlore |
| Pb (1.3) | 350 | 670 | 1.09 | PbO + Perovskite |

The ferroelectric properties of the PZT films on Pt/SiO$_2$/Si substrates were confirmed by the P-E hysteresis measurements. FIG. 4 shows a typical P-E hysteresis loop of the PZT film with optimized processing condition. The remnant polarization is about 30 $\mu$C cm$^{-2}$ and coercive field is about 80 kV cm$^{-1}$, corresponding to a coercive voltage of about 0.8 V. A summary of the dielectric and electrical properties of the PZT films on a Pt/SiO$_2$Si substrate with optimized processing conditions is given in Table 3. The lower than desired value of dielectric constant is likely due to the interdiffusion at the Pt interface and some loss of Pb at the surface, as will later be discussed.

TABLE 3

The dielectric and electrical properties of the PZT films with optimized processing condition

| Leakage current density (A cm$^{-2}$)[a] | Breakdown field (V cm$^{-1}$) | Dielectric constant[b] | Dielectric loss tan δ | Remanent polarization ($\mu$C cm$^{-2}$) | Coercive Field (kV/cm$^2$) |
|---|---|---|---|---|---|
| 2 × 10$^{-7}$ | 1 × 10$^6$ | 548 | 0.03 | 30 | 80 |

[a] At a field of 4 × 10$^5$ V cm$^{-1}$.
[b] At 1.0 MHz.

Multi-layer Structure

Interaction between PZT and the bottom electrode deteriorates the electrical properties and also reduces the crystallinity of the PZT films. In order to overcome this problem, the preferred multi-layer structure combined PZT and BaTiO$_3$ layers to suppress the interdiffusion between Pt and Pb and also to increase the crystallinity of the PZT layer. The cross-section of the multi-layer capacitor structure is shown in FIG. 5. The bottom BatiO$_3$ layer deposited at 300° C. was amorphous (a); however, it became microcrystalline (m) owing to the thermal treatment during later polycrystalline (p) BaTiO$_3$ deposition at 700° C. The PZT layer was then deposited at 350° C. followed by furnace annealing at 620° C. for 30 min. The sample was finished by RF sputtering of the top amorphous BaTiO$_3$ layer with the substrate temperature at 350° C. Typical electrical properties are given in Table 4.

TABLE 4

Electrical properties of the multi-layer structure

| Thickness (nm) | Capacitance density (× 10$^5$ pF cm$^{-2}$) | Dielectric constant[a] | Leakage current density (A cm$^{-2}$) at 1.5 × 10$^5$ V cm$^{-1}$ |
|---|---|---|---|
| 245 | 16 | 442 | 2 × 10$^{-9}$ |

[a] At 1.0 MHz.

The electrical properties of the nanolayer BaTiO$_3$ structure, a-BaTiO$_3$/poly-BaTiO$_3$/micro-BaTiO$_3$ are superior. By taking advantage of the best properties from both amorphous and polycrystalline BaTiO$_3$ structures, the nanolayer a-BaTiO$_3$/poly-BaTiO$_3$/micro-BaTiO$_3$, (thickness 20 nm/280 nm/20 nm), with a very low leakage current of 2×10$^{-6}$ A cm$^{-2}$ at a field of 4×10$^5$ V cm$^{-1}$ and an effective dielectric constant of 259 was achieved.

The relative dielectric constant for the BaTiO$_3$ film deposited at a temperature of 200° C. was 21.6 but about 220 after thermal treatment at 700° C. The second BaTiO$_3$ layer deposited at 700° C. to form a polycrystalline structure had a dielectric constant of about 400. For the single BaTiO$_3$ layer deposited at 700° C., the dielectric constant of the BaTiO$_3$ film did not give values higher than 300 owing to the interaction between the BaTiO$_3$ film and the bottom electrode, which formed some complex compounds with very low values of dielectric constant at the interface. The dielectric constant of the PZT layer, however, was assumed to be 548, the same as that of the single PZT film. The termination layer of the capacitors, deposited at 350° C. with dielectric constant of about 40, was amorphous since there was no further high temperature treatment. The film thickness of each layer was about 15 nm., 15 nm., 200 nm., and 15 nm. corresponding to the microcrystal BaTiO$_3$, polycrystalline BaTiO$_3$, PZT, and top amorphous BaTiO$_3$ layers, respectively.

The effective capacitance of the multi-layer structure is a series connection of micro-BaTiO$_3$, poly-BaTiO$_3$, PZT and a-BaTiO$_3$, dielectrics. Theoretically, the effective dielectric constant $\in_{eff}$, can be expressed as $$1/\in_{eff} = (t_m/\in_m + t_p/\in_p + t_z/\in_z + t_a/\in_a)/(t_m + t_p + t_z + t_a)$$

where $t_m$, $t_p$, $t_z$, and $t_a$, are the thicknesses of micro-BaTiO3, poly-BaTiO$_3$, PZT and a-BaTiO$_3$ layers, respectively. The $\in_m$, $\in_p$, $\in_z$, and $\in_a$, denote the dielectric constants for micro-BaTiO$_3$, poly-BaTiO$_3$, PZT and a-BaTiO$_3$ layers, respectively. The theoretical evaluation of $\in_{eff}$ was calculated based on the electrical measurement on the multi-layer capacitors to be 400 which gave the $\in_z$ to be about 880 if the relative dielectric constants of BaTiO$_3$ layers are fixed.

The large increase in the relative dielectric constant of the PZT layer may-be due to the increase of the crystallinity of the PZT layer with this multi-layer structure. A higher degree of crystallinity was obtained for the PZT film with a multi-layer structure due to the use of the seeding poly-BaTiO$_3$ layer.

The interdiffusion problem was estimated by conducting ABS profiling measurements of single and multi-layer PZT on a Pt bottom electrode. The diffusion of Pb into the Pt bottom electrode was observed for the single PZT layer. However, for the multi-layer structure, the BaTiO$_3$ layers prevented interdiffusion between Pb and Pt.

Figure 6:
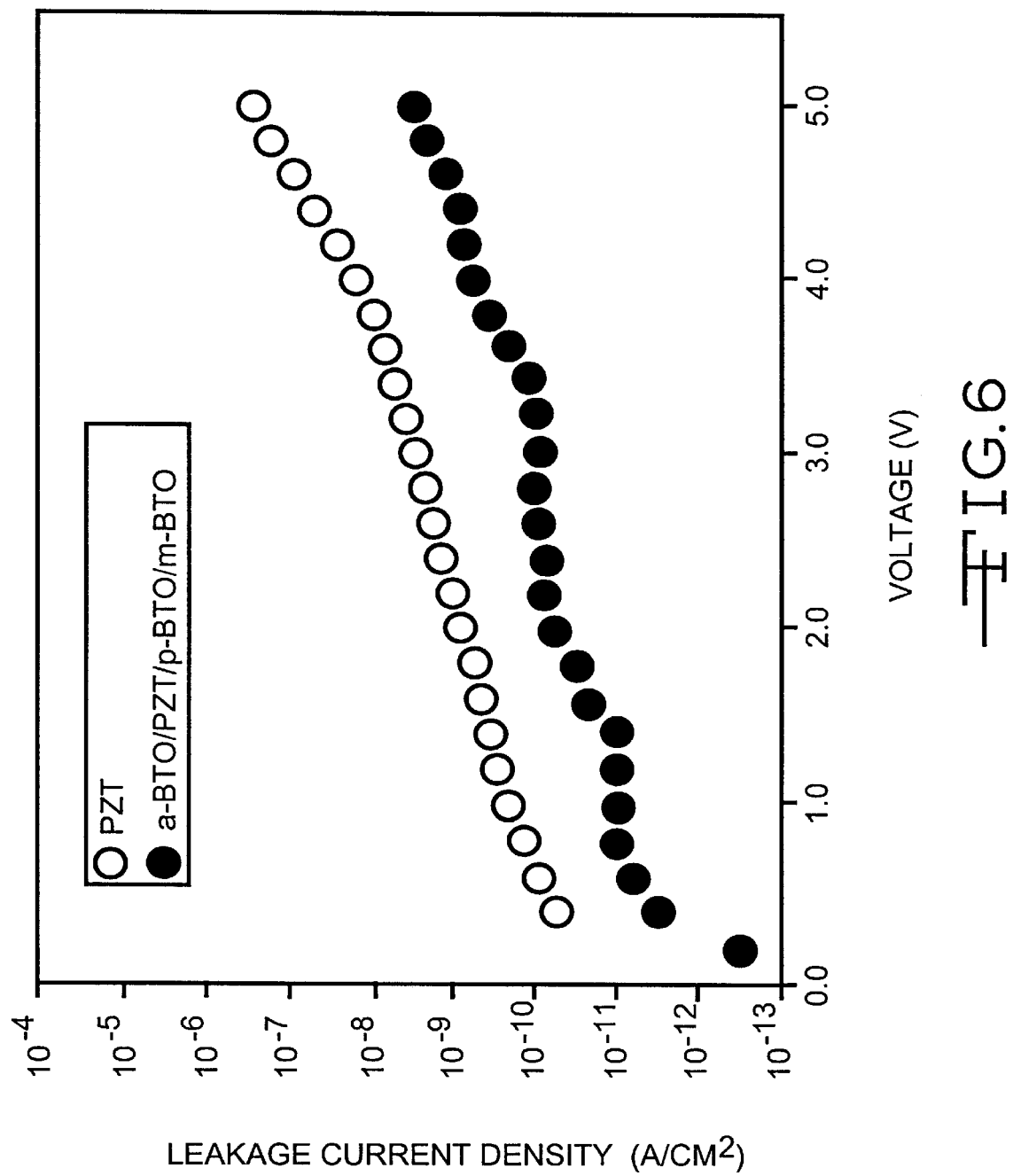
FIG. 6 shows the I–V characteristics of the single PZT and multi-layer structures.

One of the most significant advantages of the multi-layer structure of the present invention is the significant reduction of the leakage current density compared to the single PZT layer structure. The leakage current density in the range of $10^{-8}$ A cm$^{-2}$ at a field intensity $1 \times 10^5$ V cm$^{-1}$ was obtained for the multi-layer structure, which is about two orders of magnitude lower compared with the single PZT layer discussed in the previous section. FIG. 6 shows the I–V characteristics of the single PZT and multi-layer structures.

The significant reduction in the leakage current density while accomplishing such a high effective dielectric constant by using the multi-layer structure could be attributed to the following.

The first micro-crystalline layer of BTO serves as a protective buffer between the Pt electrode and subsequently deposited thin film layers. At the same time the first microcrystalline layer of BTO provides advantageous chemical and crystal structure upon which further layers may be deposited.

In addition, during polycrystalline BaTiO$_3$ film deposition, charge traps generated during the amorphous BaTiO$_3$ film deposition-may be annealed out. This results in lowering of the leakage current density and an increase in the relative dielectric constant of the bottom BaTiO$_3$ layer. Furthermore, the polycrystalline BaTiO$_3$ layer may serve as the seed for the nucleation of PZT due to the same perovskite crystal structure. Finally, a top thin amorphous BaTiO$_3$ layer was deposited on the PZT to achieve the termination of the grain boundaries in the polycrystalline films which usually caused much higher leakage current.

Conclusion

The influence of the processing parameters on the PZT film properties was in terms of sputtering target composition, deposition temperature, and annealing conditions is addressed by the teachings of the present invention. The Pb content impacted the crystallization in such a way that the presence of excess Pb gave higher ease of perovskite phase formation. Therefore, under the conditions used, and described herein, in the fabrication of one embodiment of the invention, the PZT target with Pb/(Zr+Ti) ratio of 1.2 provided the preferred starting target to obtain a PZT film with a ferroelectric perovskite phase. The ideal Pb/(Zr+Ti) ratio is dependent on the processing parameters employed in a given deposition process. Those skilled in the art will recognize that the teachings of the present invention with regard to target preparation to reduce Pb loss allow for different preferred Pb/(Zr+Ti) ratios when other fabrication conditions are employed.

The single layer PZT obtained under the optimized processing parameter showed ferroelectric behavior with a remanent polarization of 30 C$\mu$ cm$^{-2}$ on a coercive field of 80 kV cm$^{-1}$. The dielectric constant of about 548 was obtained for this film with an Au/PZT/SiO$_2$/Si structure. The leakage current at a field of $4\times10^5$ V cm$^{-1}$ was about $2\times10^{-7}$ A cm$^{-2}$.

The structural and electrical properties of the PZT layer were further improved by employing the novel multi-layer structure which combined the PZT with the nanolayer BaTiO$_3$ layers. With this multi-layer structure, the leakage current density was reduced by two orders of magnitude and the effective dielectric constant of the entire structure was estimated to be around 442 which gave a relative dielectric constant of the PZT layer to be about 880. The increase of the crystallinity of the PZT layer and suppression of the interdiffusion between Pb and Pt were two major contributors to the superior electrical properties of the multi-layer structure.

It is intended that the above description of preferred embodiments of the structure and method of the present invention are but one or two enabling best mode embodiments for implementing the invention. Other modifications and variations are likely to be conceived of by those skilled in the art upon a reading of the preferred embodiments and a consideration of the appended drawings. These modifications and variations still fall within the breadth and scope of the disclosure of the present invention.

We claim:

1. A method for preparing a dielectric article comprising forming two or more dielectric materials into film layers arranged in opposing juxtaposition, a first film layer comprising a first dielectric material in microcrystalline configuration, a second film layer comprising said first dielectric material in polycrystalline configuration, a third film layer comprising a ferroelectric second dielectric material, and a fourth film layer comprising said first dielectric material in amorphous configuration, and arranging said opposing layers between upper and lower electrodes.

2. The method of claim 1 wherein said dielectric article is arranged in a semiconductor substrate structure.

3. The method of claim 1 wherein said dielectric article is arranged on a substrate comprising a material selected from the group consisting of dielectric material, metal film and glass.

* * * * *